(12) United States Patent
Tao et al.

(10) Patent No.: US 12,148,850 B1
(45) Date of Patent: Nov. 19, 2024

(54) PHOTOVOLTAIC MODULE

(71) Applicants: Jinko Solar (Shangrao) Co.,Ltd, Jiangxi (CN); JINKO SOLAR CO., LTD., Jiangxi (CN)

(72) Inventors: Wusong Tao, Jiangxi (CN); Yunfei Xie, Jiangxi (CN); Yingying Peng, Jiangxi (CN); Liang Guo, Jiangxi (CN); Shun Chen, Jiangxi (CN); Jilong He, Jiangxi (CN)

(73) Assignees: Jinko Solar (Shangrao) Co., Ltd, Jiangxi (CN); Jinko Solar Co., Ltd., Jiangxi (CN)

( * ) Notice: Subject to any disclaimer, the term of this patent is extended or adjusted under 35 U.S.C. 154(b) by 0 days.

(21) Appl. No.: 18/396,268

(22) Filed: Dec. 26, 2023

(30) Foreign Application Priority Data

Dec. 13, 2023 (CN) .......................... 202311711586.8

(51) Int. Cl.
 *H01L 31/048* (2014.01)
 *H01L 31/0203* (2014.01)

(52) U.S. Cl.
 CPC ...... *H01L 31/0488* (2013.01); *H01L 31/0203* (2013.01)

(58) Field of Classification Search
 CPC ............... H01L 31/048; H01L 31/0481; H01L 31/0488; H01L 31/0203
 See application file for complete search history.

(56) References Cited

U.S. PATENT DOCUMENTS

| | | | |
|---|---|---|---|
| 5,707,459 A | 1/1998 | Itoyama et al. | |
| 2009/0114262 A1* | 5/2009 | Adriani | B23K 20/10 |
| | | | 136/244 |
| 2012/0103397 A1 | 5/2012 | Damm | |

(Continued)

FOREIGN PATENT DOCUMENTS

| | | | | |
|---|---|---|---|---|
| AU | 2018101273 A4 | * | 10/2018 | ............. B32B 27/32 |
| CN | 213601883 U | * | 7/2021 | |

(Continued)

OTHER PUBLICATIONS

Machine translation of AU-2018101273-A4, Cao J et al. (Year: 2018).*

(Continued)

*Primary Examiner* — Mayla Gonzalez Ramos
(74) *Attorney, Agent, or Firm* — Burris Law, PLLC

(57) ABSTRACT

A photovoltaic module includes a first sealing member, a pad strip, a solar cell string, and a second sealing member. A cross-linking rate of a material of the second sealing member is higher than that of a material of the first sealing member. The first sealing member, the solar cell string, and the second sealing member are sequentially arranged along a thickness direction of the photovoltaic module. The pad strip is located around the solar cell string and located between the first sealing member and the second sealing member. The pad strip is made of a same material as the first sealing member. A thickness of the first sealing member, a thickness of the second sealing member, and a thickness of the pad strip all gradually decrease along a length direction of the photovoltaic module towards an edge of the photovoltaic module.

20 Claims, 3 Drawing Sheets

(56) References Cited

U.S. PATENT DOCUMENTS

| | | | | |
|---|---|---|---|---|
| 2013/0068288 A1* | 3/2013 | Stancel | ............ | H01L 31/02008 |
| | | | | 136/251 |
| 2021/0066530 A1* | 3/2021 | Sotani | .................... | H01L 31/18 |
| 2022/0165898 A1* | 5/2022 | Gaume | ............... | H01L 31/0481 |

FOREIGN PATENT DOCUMENTS

| | | | |
|---|---|---|---|
| CN | 115241308 A | * | 10/2022 |
| WO | 2009029897 A2 | | 3/2009 |
| WO | 2013121549 A1 | | 8/2013 |
| WO | 2021161657 A1 | | 8/2021 |

OTHER PUBLICATIONS

Machine translation of CN-213601883-U, Huang T et al. (Year: 2021).*

Machine translation of CN-115241308-A, Gu W et al. (Year: 2022).*

Extended European Search Report issued in corresponding EP Application 23220312.5, issued Jul. 2, 2024, 5 pages.

\* cited by examiner

PHOTOVOLTAIC MODULE

CROSS-REFERENCE TO RELATED APPLICATION

This application claims priority to Chinese Patent Application No. 202311711586.8, filed on Dec. 13, 2023. The disclosure of the above application is incorporated herein by reference.

FIELD

The present disclosure relates to the technical field of photovoltaic modules, and in particular, to a photovoltaic module.

BACKGROUND

The statements in this section merely provide background information related to the present disclosure and may not constitute prior art.

Sealing member is an important part of a photovoltaic module. The sealing member can bond solar cells with a front glass and a back substrate and protect and support the solar cells. The sealing member has a light transmittance property so that light can pass through the sealing member and be incident on the solar cells to achieve photoelectric conversion. Conventionally the sealing member is made of ethylene-vinyl acetate copolymer (EVA) or polyolefin thermoplastic elastomer (POE). The POE sealing member has better aging resistance and a lower water vapor transmission rate than the EVA sealing member, but is more expensive. In order to control the cost of the photovoltaic module, a sealing member made of a mixture of EVA and POE is proposed. Due to a difference in cross-linking rates of the EVA and POE, bubbles and cavities easily occur in the sealing member during lamination, which affects product quality of the photovoltaic module.

SUMMARY

This section provides a general summary of the disclosure and is not a comprehensive disclosure of its full scope or all of its features.

One or more aspects of the present disclosure provide a photovoltaic module.

The photovoltaic module includes: a first sealing member, a second adhesive film, a solar cell string, and a pad strip.

A cross-linking rate of a material of the second sealing member is higher than that of a material of the first sealing member. Along a thickness direction of the photovoltaic module, the solar cell string is located between the first sealing member and the second sealing member, and an area of the solar cell string is smaller than an area of the first sealing member and is smaller than an area of the second sealing member. The first sealing member, the solar cell string, and the second sealing member are sequentially arranged along the thickness direction of the photovoltaic module. The pad strip is located around the solar cell string and is located at edges of the first sealing member and the second sealing member. The pad strip is sandwiched between the first sealing member and the sealing member. The pad strip is made of a same material as the first sealing member. A thickness of the first sealing member, a thickness of the second sealing member, and a thickness of the pad strip all gradually decrease along a length direction of the photovoltaic module towards an edge of the photovoltaic module.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
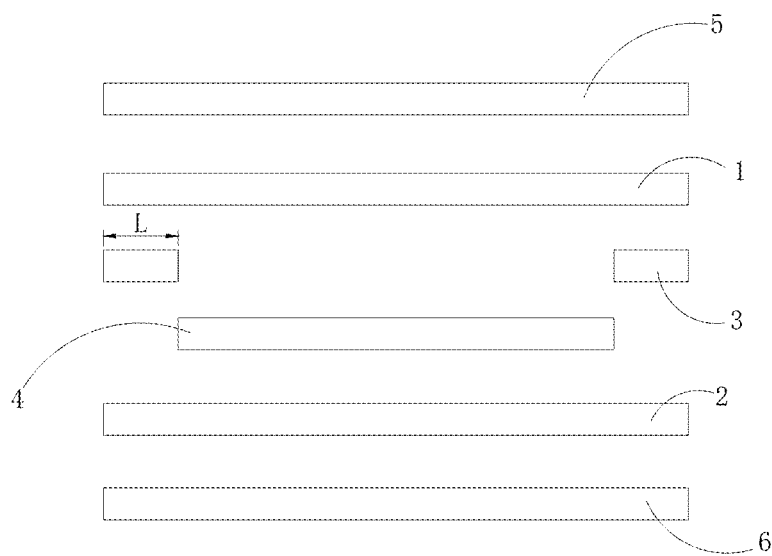
FIG. 1 is an exploded view of a photovoltaic module according to some embodiments of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In order to better understand the technical solutions of the present disclosure, some embodiments of the present disclosure will be described in detail below with reference to the accompanying drawings.

It should be clear that the described embodiments are only some of the embodiments rather than all of the embodiments of the present disclosure. Based on the embodiments in the present disclosure, all other embodiments obtained by those of ordinary skill in the art without creative efforts fall within the protection scope of the present disclosure.

The terms used in the embodiments of the present disclosure are merely for the purpose of describing specific embodiments and are not intended to limit the present disclosure. As used in the embodiments of the present disclosure and the appended claims, the singular forms of "a/an", "said", and "the" are also intended to include plural forms, unless otherwise clearly specified in the context.

It should be understood that the term "and/or" used herein describes an association relationship between associated objects and indicates that three relationships may exist. For example, A and/or B may indicate the following three cases: only A exists, both A and B exist, and only B exists. In addition, the character "/" herein generally indicates an "or" relationship between the associated objects.

A sealing member is an important encapsulation material for a photovoltaic module, and is used to protect solar cells. For example, the sealing member is made of an insulation material having light transmittance and adhesive properties, protects the solar cells, and isolates air. The price of the sealing member continually rises. Considering the overall cost and performance of the photovoltaic module, a mixture of two different sealing member materials is currently used in the photovoltaic module to control the cost. However, different sealing member materials have different cross-linking rates. During the lamination, the sealing member material with a smaller cross-linking rate is not fully cross-linked, and therefore is easily extruded, resulting in holes or bubbles in the final sealing member, which ultimately affects quality of the photovoltaic module.

Figure 2:
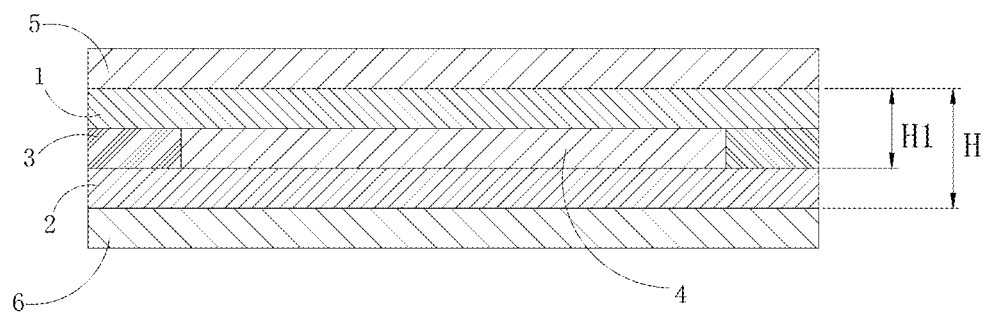
FIG. 2 is a sectional view of the photovoltaic module according to some embodiments of the present disclosure.
Figure 3:
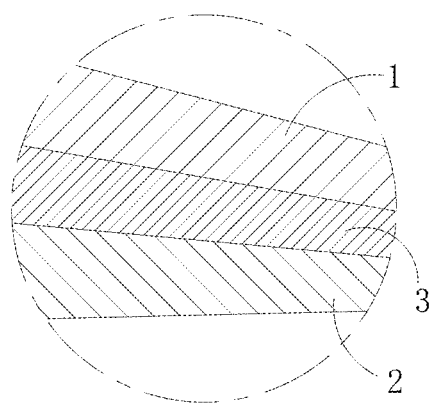
FIG. 3 is a partial sectional view of the photovoltaic module according to the present disclosure.

As shown in FIG. 1 to FIG. 3, some embodiments of the present disclosure provide a photovoltaic module. The photovoltaic module includes a first sealing member 1, a second sealing member 2, a pad strip 3, and a solar cell string 4. A cross-linking rate of a material of the second sealing member 2 is higher than that of a material of the first sealing member 1. Along a thickness direction of the photovoltaic module, the solar cell string 4 is located between the first sealing member 1 and the second sealing member 2, and an area of the solar cell string 4 is smaller than an area of the first sealing member 1 and is smaller than an area of the second sealing member 2. The first sealing member 1, the solar cell string 4, and the second sealing member 2 are sequentially arranged along the thickness direction of the photovoltaic module. The pad strip 3 is located around the solar cell string 4. The pad strip 3 is located at edges of the first sealing member 1 and the second sealing member 2 and located between the first sealing member 1 and the second sealing member 2. The pad strip 3 is made of a same material as the first sealing member 1. After the lamination process of the photovoltaic module, a thickness of the first sealing member 1, a thickness of the second sealing member 2, and a thickness of the pad strip 3 all gradually decrease along a length direction of the photovoltaic module towards an edge of the photovoltaic module.

The photovoltaic module provided in embodiments of the present disclosure has a new laminate structure. The pad strip 3 is arranged between the first sealing member 1 and the second sealing member 2. The first sealing member 1 and the second sealing member 2 are made of different materials, which facilitates control over the overall cost of the photovoltaic module. The first sealing member 1 and the second sealing member 2 are located on two sides of the solar cell string 4 respectively, and are configured to bond the solar cell string 4 to other structures of the photovoltaic module and to protect the solar cell string 4. The pad strips 3 may be arranged around the solar cell string 4 or arranged in parallel on two sides of the solar cell string 4. The pad strip 3 is located between the first sealing member 1 and the second sealing member 2. At a low temperature, the cross-linking reaction of the first sealing member 1 and the cross-linking reaction of the second sealing member 2 are slow, and it takes a long time to completely cure the first sealing member 1 and the second sealing member 2. Therefore, during the lamination, it needs to heat the first sealing member 1, the second sealing member 2, and the pad strip 3 to an appropriate temperature. After the temperature rises, the first sealing member 1, the second sealing member 2, and the pad strip 3 can have certain fluidity, and undergo a curing reaction at the same time. As the reaction proceeds, the first sealing member 1, the second sealing member 2, and the pad strip 3 finally lose the fluidity and achieve an encapsulation function. A cross-linking agent may be added to the material of the sealing member. During cross-linking, decomposition of the cross-linking agent may produce a certain amount of gas, resulting in bubbles. On the other hand, during the lamination, pressure may be applied on the photovoltaic module. Since the cross-linking rate of the first sealing member 1 is lower than that of the second sealing member 2, part of the first sealing member 1 may be extruded out of the photovoltaic module, resulting in cavities. The photovoltaic module in the present disclosure includes the pad strip 3. The pad strip 3 can additionally supplement the first sealing member 1. Even part of the first sealing member 1, part of the pad strip 3, and part of the second sealing member 2 may be extruded during the lamination, and the thickness of the first sealing member 1, the thickness of the second sealing member 2, and the thickness of the pad strip 3 may all gradually decrease along the direction towards the edge of the photovoltaic module, forming a structure in which the overall thickness of the sealing member gradually decreases along the edge of the photovoltaic module. Due to the slow cross-linking rate of the first sealing member 1, more material of the first sealing member 1 may be extruded out of the photovoltaic module. The pad strip 3 can supplement the extruded parts of the first sealing member 1 and reduce a possibility of occurrence of cavities and bubbles during the lamination of the photovoltaic module, thereby improving the quality of the photovoltaic module.

As shown in FIG. 2, in some embodiments, a total thickness of the first sealing member 1, the second sealing member 2, and the pad strip 3 is H, the total thickness of the first sealing member 1 and the pad strip 3 is H1, and at a position at a distance greater than or equal to 3 mm from the edge of the photovoltaic module, H1/H≥24%.

In some embodiments of the present disclosure, the thicknesses of the first sealing member 1, the second sealing member 2, and the pad strip 3 have a certain proportional relationship. By setting a reasonable proportional relationship, the pad strip 3 can reduce the occurrence of bubbles and cavities, without affecting the lamination of the photovoltaic module. If the thickness of the pad strip 3 is large, material may be wasted, which may increase the cost and is not conducive to the lamination of the photovoltaic module. If the thickness of the pad strip 3 is small, the pad strip 3 cannot fully achieve a filling effect, causing the first sealing member 1 with a slow cross-linking rate to be extruded to produce cavities or bubbles, which affects the quality of the photovoltaic module. In the photovoltaic module provided in some embodiments of the present disclosure, at a position that has a distance of 3 mm with respect to the edge of the photovoltaic module after lamination, a ratio of the total thickness of the first sealing member 1 and the pad strip 3 to the total thickness of the first sealing member 1, the second sealing member 2, and the pad strip 3 is greater than or equal to 24%. By setting H1/H≥24%, after the lamination of the photovoltaic module, the cross-linked first sealing member 1, the cross-linked pad strip 3, and the cross-linked second sealing member 2 are sufficient, forming a good adhesion and sealing effect on the solar cell string. The pad strip 3 achieves a sufficient filling effect, reduces the possibility of occurrence of bubbles and cavities during the lamination, and improves the quality of the photovoltaic module.

As shown in FIG. 1, in some embodiments, a width of the pad strip 3 is L, and L satisfies 20 mm≤L≤30 mm.

The pad strip 3 may be in a rectangle shape. The pad strips 3 may be symmetrically arranged on two parallel edges of the photovoltaic module, or the pad strips 3 may be arranged on four edges of the photovoltaic module. That is, the pad strips 3 surround the solar cell string 4. The width of the pad strip 3 affects a volume and an action range of the pad strip 3. The width of the pad strip 3 within a reasonable range can enable the pad strip 3 to achieve a good filling effect. If the width of the pad strip 3 is excessively small, the filling effect of the pad strip 3 may be affected. If the width of the pad strip 3 is excessively large, it is not conducive to reducing the cost.

In some embodiments, the first sealing member 1 and the pad strip 3 are made of POE, and the second sealing member 2 is made of EVA.

Conventionally, sealing member material includes EVA (ethylene-vinyl acetate copolymer) and POE (polyolefin thermoplastic elastomer). Both the EVA sealing member and the POE sealing member may be configured to encapsulation of single-glass photovoltaic module and encapsulation of double-glass photovoltaic module. However, the POE sealing member has certain performance advantages in many aspects. Firstly, in terms of bulk resistance, the bulk resistivity of the EVA sealing member decreases rapidly as the temperature increases, and the bulk resistivity of the POE sealing member at a high temperature is much higher than that of the EVA sealing member. In addition, POE is a non-polar material and cannot form hydrogen bonds with water molecules. As a result, POE cannot absorb water vapor like EVA and has water vapor transmission rate much lower than that of EVA. Due to a saturated structure of a macromolecular chain of POE, the molecular structure contains relatively few tertiary carbon atoms, so POE has better heat aging resistance and UV resistance than EVA. However, the price of POE continuously rises. The encapsulation material of the photovoltaic module begins to be a mixing of POE and EVA, which can ensure the performance and reduce the cost. The pad strip 3 provided in some embodiments of the present disclosure is made of POE. Since a cross-linking rate of POE is lower than that of EVA, POE is more easily extruded during lamination, resulting in a decrease in POE. In the present disclosure, through the arrangement of the pad strip 3 made of POE, an effect of supplementing the material of the POE sealing member can be achieved, the possibility of occurrence of bubbles or cavities due to extrusion of POE is reduced, and the quality of the photovoltaic module is improved. The pad strip 3 may alternatively be made of other materials. The pad strip 3 is made of a material with a lower cross-linking rate, which can achieve an effect of supplementing materials with a slower cross-linking rate during the lamination. The materials of the first sealing member 1 and the second sealing member 2 may alternatively be selected from materials other than EVA and POE, such as polyvinyl butyral film (PVB). The material of the pad strip 3 is adjusted correspondingly according to the materials of the first sealing member 1 and the second sealing member 2, to achieve a function of supplementing the extruded material.

Figure 4:
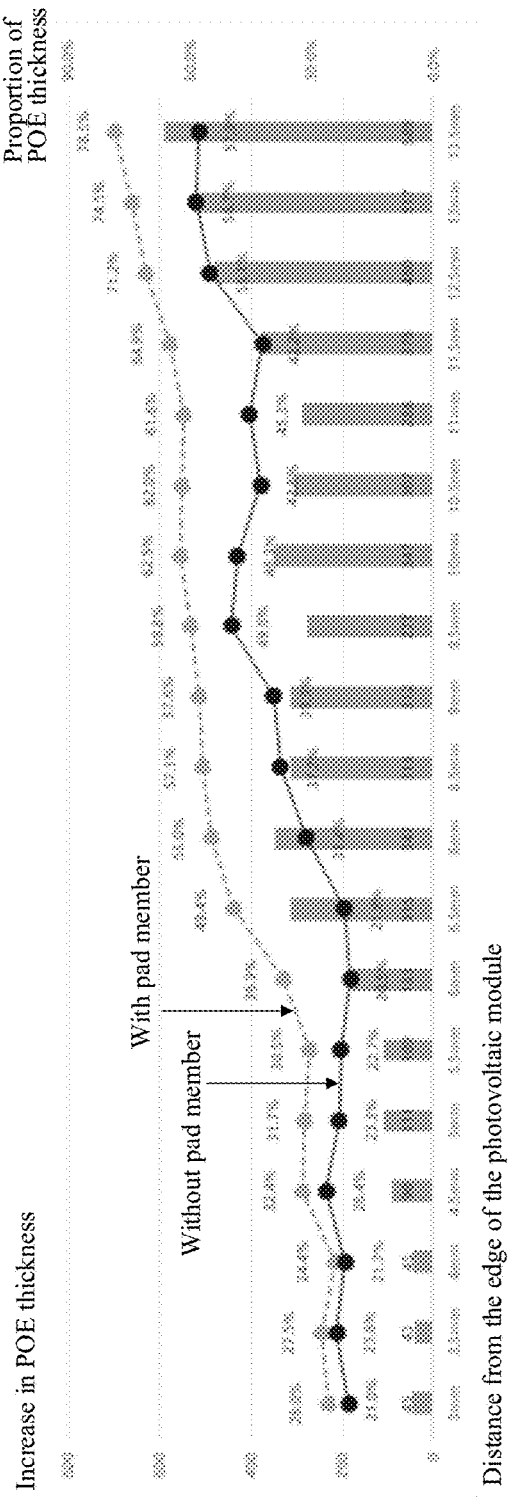
FIG. 4 is a graph showing test data of a photovoltaic module with a pad strip and a photovoltaic module without the pad strip.

FIG. 4 is a graph showing test data of the photovoltaic module with the pad strip 3 and the photovoltaic module without the pad strip 3. The dotted broken line represents a data trend of the photovoltaic module with the pad strip 3. The solid broken line represents a data trend of the photovoltaic module without the pad strip 3. The horizontal axis represents distances between test points and the edge of the photovoltaic module. The vertical axis on the right represents proportions of POE thicknesses. The dotted broken line and the solid broken line respectively represent proportions of POE thicknesses in a total thickness of the first sealing member 1, the second sealing member 2, and the pad strip 3 after lamination. The dotted line is above the solid line, indicating that the proportion of POE increases after the arrangement of the pad strip 3. The material of the pad strip 3 is POE, so the pad strip 3 is not completely extruded during the lamination, which can achieve a filling effect, supplement the POE of the first sealing member 1, and reduce the possibility of occurrence of cavities and bubbles during the lamination. The vertical axis on the left represents increases in the POE thicknesses. The height of the bar chart represents specific values of the increases. In all the test positions shown in the figure, the POE thicknesses increase to some extent, and as the distance away from the edge of the photovoltaic module increases, the overall increase in the POE thickness also shows a gradually increasing trend. Based on the above, through the arrangement of the pad strip 3, POE can be supplemented, thereby reducing the possibility of occurrence of bubbles and cavities during the lamination and improving the quality of the photovoltaic module.

In some embodiments, a gram weight of the pad strip 3 is 150 g/m$^2$ to 400 g/m$^2$, and a thickness of the pad strip 3 is 0.1 mm to 0.4 mm.

The gram weight of the pad strip 3 affects thickness, strength, and light transmittance of the sealing member. A smaller gram weight can reduce the overall weight of the photovoltaic module and reduce the burden of transportation and mounting, and at the same time, can improve light transmission performance of the photovoltaic module and improve performance of the photovoltaic module. The gram weight of the sealing member can be controlled by controlling the thickness of the pad strip 3. Prior to the lamination, the thickness of the pad strip 3 is 0.15 mm to 0.45 mm. After the lamination, the pad strip 3 may deform to some extent and may be cross-linked with the first sealing member 1 and the second sealing member 2. The thickness of the pad strip 3 may be reduced to some extent after the lamination. The thickness of the pad strip 3 after the lamination is 0.1 mm to 0.4 mm. In some embodiments of the present disclosure, through the selection of the pad strip 3 with an appropriate gram weight, the performance of photovoltaic module can be improved, and the cost can be reduced.

In some embodiments, gram weights of the first sealing member 1 and the second sealing member 2 are 300 g/m$^2$ to 500 g/m$^2$, and the thicknesses of the first sealing member 1 and the second sealing member 2 are 0.25 mm to 0.55 mm.

Similar to the principle of the pad strip 3, the gram weights of the first sealing member 1 and the second sealing member 2 may also affect the performance and cost of the photovoltaic module, and action areas of the first sealing member 1 and the second sealing member 2 are larger than an action area of the pad strip 3. Therefore, the first sealing member 1 and the second sealing member 2 have a greater impact on the photovoltaic module. The thicknesses of the first sealing member 1 and the second sealing member 2 are 0.3 mm to 0.6 mm prior to the lamination, and may be reduced to some extent by the lamination. After the lamination, the thicknesses of the two are 0.25 mm to 0.55 mm. Through the selection of the first sealing member 1 and the second sealing member 2 with appropriate gram weights, the performance and the cost can be easily controlled.

In some embodiments, the photovoltaic module includes a plurality of pad strips 3. The plurality of pad strips 3 surround the solar cell string 4, and the pad strips 3 are located on a side of the solar cell string 4 close to the first sealing member 1 or on a side of the solar cell string 4 close to the second sealing member 2.

The position of the pad strip 3 relative to the solar cell string 4 can be flexibly set according to an actual requirement. The photovoltaic module may be provided with a plurality of pad strips 3. The pad strips 3 may be arranged at the head and the tail of the solar cell string 4 respectively, and the pad strips 3 are parallel to each other. The pad strips 3 may alternatively be arranged around the solar cell string 4, and the pad strips 3 arranged around the solar cell string 4 are respectively parallel to corresponding four sides of the photovoltaic module. Through the arrangement of the plurality of pad strips 3, more sufficient filling can be achieved, and different positions of the photovoltaic module can be filled, so that the possibility of occurrence of bubbles and cavities at different positions of the photovoltaic module can be reduced. Therefore, stability of the product quality can be improved.

Figure 5:
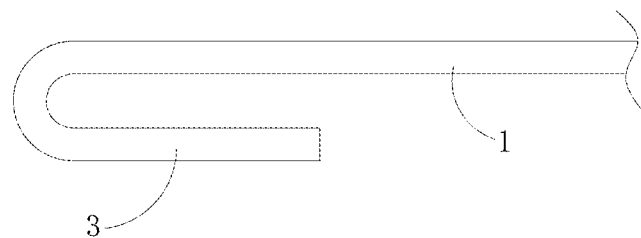
FIG. 5 is a schematic structural diagram of the pad strip according to some embodiments of the present disclosure.

As shown in FIG. 5, in some embodiments, the first sealing member 1 and the pad strip 3 are integrally formed. That is, the first sealing member 1 and the pad strip 3 are formed into one piece.

The first sealing member 1 is made of an elastic material and thus can deform to some extent. When the first sealing member 1 is arranged, the area of the first sealing member 1 is appropriately increased, and an edge part of the first sealing member 1 is folded before lamination, so that part of the first sealing member 1 has a double-layer structure, and the folded part becomes the pad strip 3, realizing the integral formation of the first sealing member 1 and the pad strip 3. The integral formation of the first sealing member 1 and the pad strip 3 can reduce machining costs.

In some embodiments, the thicknesses of the pad strip 3 and the first sealing member 1 are the same.

When the first sealing member 1 and the pad strip 3 are integrally formed, part of the first sealing member 1 is folded, and the folded part forms the pad strip 3, so the thickness of the pad strip 3 is the same as that of the first sealing member 1. The first sealing member 1 and the pad strip 3 overlap each other along the thickness direction of the photovoltaic module. The pad strip 3 has a sufficient thickness during lamination to fully achieve the filling effect, which supplements the first sealing member 1 extruded during the lamination, reduces the possibility of occurrence of bubbles and cavities in the photovoltaic module, and improves product quality.

In some embodiments, the photovoltaic module further includes a front substrate 5 and a back substrate 6. The first sealing member 1, the solar cell string 4, the pad strip 3, and the second sealing member 2 are located between the front substrate 5 and the back substrate 6. The front substrate 5 and/or the back substrate 6 are/is made of glass.

The front substrate 5 and the back substrate 6 are located on two opposite sides of the photovoltaic module respectively to protect and support the first sealing member 1, the solar cell string 4, the pad strip 3, and the second sealing member 2. When the photovoltaic module is mounted on the ground or roof, the front substrate 5 is located on a side away from the ground or roof. Therefore, the front substrate 5 is made of glass with good light transmittance, and sunlight passing through the front substrate 5 can act on the solar cell string 4, thereby achieving photoelectric conversion and ensuring high operational efficiency of the photovoltaic module. The back substrate 6 is located on a side of the photovoltaic module opposite to the front substrate 5. The back substrate 6 may be made of an opaque material, or the back substrate 6 may be made of a light-transmissive material. When the front substrate 5 and the back substrate 6 of the photovoltaic module are both made of glass, the photovoltaic module is a double-glass module. A front surface can receive sunlight. In addition, the back substrate 6 of the photovoltaic module can also transmit light. The sunlight reflected by ground or roof passes through the back substrate 6 and reaches a back surface of the solar cell, so that the sunlight can be fully utilized, thereby improving overall operational efficiency of the photovoltaic module.

The present disclosure provides a photovoltaic module. The photovoltaic module includes a first sealing member 1, a pad strip 3, a solar cell string 4, and a second sealing member 2. A cross-linking rate of a material of the second sealing member 2 is higher than that of a material of the first sealing member 1. The solar cell string 4 is located between the first sealing member 1 and the second sealing member 2. The first sealing member 1, the solar cell string 4, and the second sealing member 2 are sequentially arranged along a thickness direction of the photovoltaic module. The pad strip 3 is located around the solar cell string 4 and located between the first sealing member 1 and the second sealing member 2. The pad strip 3 is made of a same material as the first sealing member 1. Thicknesses of the first sealing member 1, the second sealing member 2, and the pad strip 3 all gradually decrease along a length direction of the photovoltaic module towards an edge of the photovoltaic module. Through the arrangement of the pad strip 3, a possibility of occurrence of bubbles and cavities during lamination of the photovoltaic module can be reduced, and quality of the photovoltaic module can be improved.

The structure, features, and effects of the present disclosure have been described in detail with reference to the embodiments shown in the accompanying drawings. The above embodiments are only preferred embodiments of the present disclosure, but the implementation scope of the present disclosure is not limited to the accompanying drawings as shown. Any changes made according to the concept of the present disclosure, or equivalent embodiments that are modified to equivalent variations, should still fall within the protection scope of the present disclosure if they do not go beyond the spirit covered by the specification and the drawings.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A photovoltaic module, comprising:
a front substrate;
a first sealing member;
a back substrate;
a second sealing member, wherein a cross-linking rate of a material of the second sealing member is higher than that of a material of the first sealing member;
a solar cell string, wherein along a thickness direction of the photovoltaic module, the solar cell string is located between the first sealing member and the second sealing member, and an area of the solar cell string is smaller than an area of the first sealing member and is smaller than an area of the second sealing member; and a pad strip, wherein the first sealing member, the solar cell string, and the second sealing member are sequentially arranged along the thickness direction of the photovoltaic module, the pad strip is located around the solar cell string, and the pad strip is located at edges of the first sealing member and the second sealing member and sandwiched between the first sealing member and the sealing member, wherein the pad strip is made of a same material as the first sealing member, and a thickness of the first sealing member, a thickness of the second sealing member, and a thickness of the pad strip all gradually decrease along a length direction of the photovoltaic module towards an edge of the photovoltaic module, wherein the front substrate is positioned on a front side of the solar cell string, the first sealing member is positioned between the front substrate and the solar cell string, the back substrate is positioned on a back side of the solar cell string, the second sealing member is positioned between the back substrate and the solar cell string, and the front side of the solar cell string is a receiving side.

2. The photovoltaic module according to claim 1, wherein a total thickness of the first sealing member, the second sealing member, and the pad strip is H, a total thickness of the first sealing member and the pad strip is H1, and at a position with a distance greater than or equal to 3 mm from the edge of the photovoltaic module, H and H1 satisfy H1/H≥24%.

3. The photovoltaic module according to claim 1, wherein a width L of the pad strip satisfies 20 mm≤L≤30 mm.

4. The photovoltaic module according to claim 1, wherein the first sealing member and the pad strip are made of polyolefin thermoplastic elastomer (POE), and the second sealing member is made of ethylene-vinyl acetate copolymer (EVA).

5. The photovoltaic module according to claim 4, wherein a gram weight of the pad strip is 150 g/m$^2$ to 400 g/m$^2$, and the thickness of the pad strip is 0.1 mm to 0.4 mm.

6. The photovoltaic module according to claim 4, wherein gram weights of the first sealing member and the second sealing member are 300 g/m$^2$ to 500 g/m$^2$, and the thicknesses of the first sealing member and the second sealing member are 0.25 mm to 0.55 mm.

7. The photovoltaic module according to claim 1, wherein the pad strip comprises a plurality of pad strips surrounding the solar cell string, and the plurality of pad strips are located on a side of the solar cell string adjacent to the first sealing member or on a side of the solar cell string adjacent to the second sealing member.

8. The photovoltaic module according to claim 1, wherein the first sealing member and the pad strip are formed into one piece.

9. The photovoltaic module according to claim 1, wherein the thicknesses of the pad strip and the first sealing member are the same.

10. The photovoltaic module according to claim 1, wherein the front substrate is made of glass, and the back substrate is made of an opaque material.

11. The photovoltaic module according to claim 1, wherein the back substrate is made of glass.

12. The photovoltaic module according to claim 1, wherein both the front substrate and the back substrate are made of glass.

13. The photovoltaic module according to claim 1, wherein the solar cell string and the pad strip are arranged in a same plane.

14. The photovoltaic module according to claim 1, wherein the pad strip comprises two pad strips, and the two pad strips are respectively arranged at a head side of the solar cell string and a tail side of the solar cell string.

15. The photovoltaic module according to claim 14, wherein the solar cell string extends along the length direction of the photovoltaic module, and the two pad strips both extend along a width direction of the photovoltaic module.

16. The photovoltaic module according to claim 1, wherein one of the first sealing member and the second sealing member are made of polyvinyl butyral (PVB).

17. The photovoltaic module according to claim 1, wherein the first sealing member, the second sealing member, and the pad strip are cured by a cross-linking reaction.

18. The photovoltaic module according to claim 17, wherein the cross-linking rate of the material of the second sealing member is higher than that of a material of the pad strip.

19. The photovoltaic module according to claim 1, wherein the first sealing member and the second sealing member are made of insulation materials.

20. The photovoltaic module according to claim 1, wherein the pad strip and the first sealing member are made of a same light transmitting material.

* * * * *